United States Patent
Satoh et al.

(10) Patent No.: US 6,670,687 B2
(45) Date of Patent: Dec. 30, 2003

(54) SEMICONDUCTOR DEVICE HAVING SILICON CARBIDE LAYER OF PREDETERMINED CONDUCTIVITY TYPE AND MODULE DEVICE HAVING THE SAME

(75) Inventors: Katsumi Satoh, Tokyo (JP); Shinichi Ishizawa, Fukuoka (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/976,157

(22) Filed: Oct. 15, 2001

(65) Prior Publication Data

US 2003/0006471 A1 Jan. 9, 2003

(30) Foreign Application Priority Data

Jun. 25, 2001 (JP) ......................... 2001-190991

(51) Int. Cl.⁷ ................. H01L 29/47; H01L 29/812; H01L 31/07; H01L 31/108
(52) U.S. Cl. ................. 257/471; 257/55; 257/77; 257/267; 257/280
(58) Field of Search .................. 257/77, 472, 279, 257/485, 280, 607, 267, 12, 200, 347, 453, 476, 481, 55, 603, 612, 622, 655, 764, 53, 750, 506, 471

(56) References Cited

U.S. PATENT DOCUMENTS

| | | | | |
|---|---|---|---|---|
| 4,066,855 A | * | 1/1978 | Zenk ......................... 200/5 A |
| 4,173,764 A | * | 11/1979 | de Cremoux ............... 257/192 |
| 4,450,372 A | * | 5/1984 | Diamand ..................... 327/237 |
| 4,651,168 A | * | 3/1987 | Terajima et al. ............ 347/201 |
| 4,821,090 A | * | 4/1989 | Yokoyama .................. 257/195 |
| 4,829,346 A | * | 5/1989 | Kasahara et al. ........... 257/184 |
| 4,868,614 A | * | 9/1989 | Yamazaki ..................... 257/65 |
| 4,894,698 A | * | 1/1990 | Hijikigawa et al. ......... 257/254 |
| 4,938,569 A | * | 7/1990 | Tsunoda et al. ............. 349/106 |
| 5,144,379 A | * | 9/1992 | Eshita et al. ................. 257/194 |
| 5,192,987 A | * | 3/1993 | Khan et al. ............... 257/183.1 |
| 5,229,623 A | * | 7/1993 | Tanoue et al. ................ 257/25 |
| 5,471,072 A | * | 11/1995 | Papanicolaou ................ 257/77 |
| 5,532,507 A | * | 7/1996 | Wada .......................... 257/280 |
| 5,550,408 A | * | 8/1996 | Kunitomo et al. .......... 257/737 |
| 5,559,822 A | * | 9/1996 | Pankove et al. .............. 372/50 |
| 5,867,151 A | * | 2/1999 | Nakai .......................... 345/173 |
| 5,903,015 A | * | 5/1999 | Shiomi et al. ................. 257/77 |
| 5,937,295 A | * | 8/1999 | Chen et al. .................. 438/257 |
| 5,990,617 A | * | 11/1999 | Kanae et al. ................. 313/582 |
| 6,031,250 A | * | 2/2000 | Brandes et al. ................ 257/77 |
| 6,064,082 A | * | 5/2000 | Kawai et al. ................ 257/192 |
| 6,191,447 B1 | * | 2/2001 | Baliga ......................... 257/330 |
| 6,208,019 B1 | * | 3/2001 | Tane et al. ................... 257/679 |
| 6,313,482 B1 | * | 11/2001 | Baliga .......................... 257/77 |
| 6,350,946 B1 | * | 2/2002 | Miyake et al. .............. 136/252 |
| 6,419,746 B1 | * | 7/2002 | Banno et al. ................ 118/323 |
| 6,524,900 B2 | * | 2/2003 | Dahlqvist et al. ........... 438/167 |
| 2001/0009689 A1 | * | 7/2001 | Himeshima et al. .......... 427/64 |
| 2002/0008258 A1 | * | 1/2002 | Baba ........................... 257/273 |
| 2002/0125482 A1 | * | 9/2002 | Friedrichs et al. ............. 257/73 |

FOREIGN PATENT DOCUMENTS

| | | | | |
|---|---|---|---|---|
| JP | 361027663 A | * | 2/1986 | ................. 257/682 |
| JP | 401253289 A | * | 10/1989 | ................. 257/419 |
| JP | 3-136252 | | 6/1991 | |
| JP | 9-307100 | | 11/1997 | |

* cited by examiner

Primary Examiner—Amir Zarabian
Assistant Examiner—Ida M. Soward
(74) Attorney, Agent, or Firm—Oblon, Spivak, McClelland, Maier & Neustadt, P.C.

(57) ABSTRACT

A semiconductor device having a silicon carbide layer of a singular conductivity type. The silicon carbide layer includes a surface having a first region, a second region, and a third region sandwiched between the first region and the second region. An anode electrode having a Schottky contact with the first region, a cathode electrode having an ohmic contact with the second region, and a control electrode having a Schottky contact with the third region are included in the semiconductor device.

8 Claims, 5 Drawing Sheets

SEMICONDUCTOR DEVICE HAVING SILICON CARBIDE LAYER OF PREDETERMINED CONDUCTIVITY TYPE AND MODULE DEVICE HAVING THE SAME

BACKGROUND OF THE INVENTION

1. Field of the Invention

The present invention relates to a semiconductor device basically made of silicon carbide and a module device incorporating the semiconductor device. In this specification, the present invention is discussed, taking a case of high-voltage semiconductor device as an example, but the present invention is not limited to such an application and can be applied to semiconductor devices for various uses.

2. Description of the Background Art

As well known, a current inverter needs voltage blocking capability of reverse direction. Therefore, a current inverter which has a switching element without voltage blocking capability of reverse direction (e.g., IGBT and power MOSFET) generally uses a diode connected in series to the switching element.

FIG. 7 is a vertical cross section showing a background-art module element used for a current inverter. As shown in FIG. 7, a switching device 601 and a diode 602 both of which are basically made of silicon are provided in an encapsulating container 617.

The switching device 601 has a cathode electrode 603 and a control electrode 604 formed on a surface thereof and an anode electrode 605 formed on a back surface thereof. The diode 602 has an anode electrode 606 formed on a surface thereof and a cathode electrode 607 formed on a back surface thereof. The anode electrode 605 of the switching device 601 and the cathode electrode 607 of the diode 602 are both soldered onto a conducting board 608. Therefore, these electrodes 605 and 607 are electrically connected to each other with a solder layer 609 and the conducting board 608 interposed therebetween. Contrary to this, the cathode electrode 603 and the control electrode 604 of the switching device 601 are connected to a cathode conducting bar 610 and a control conducting bar 611 with bonding wires 613, respectively. The anode electrode 606 of the diode 602 is connected to an anode conducting bar 612 with a bonding wire 613.

On the other hand, the conducting board 608 is connected to a metal body 615 comprising a hollow trench 616 with an insulating substrate 614 interposed therebetween. In the trench 616, a cooling medium such as water is circulated. With such a structure, heat generated by loss of the switching device 601 and the diode 602 is radiated through the electrodes 605 and 607, the solder layer 609, the conducting board 608, the insulating substrate 614, the metal body 615 and the cooling medium which are formed on the back surfaces thereof.

Silicon carbide, which has larger energy gap between bands than silicon, is highly thermally stable. Therefore, a device using silicon carbide is operable even at a high temperature up to 1000 Kelvin. Moreover, since silicon carbide has larger thermal conductivity than silicon, silicon carbide devices can be arranged at high densities. Further, silicon carbide, which has breakdown voltage about ten times as large as silicon, is suitable to be used as a base material for a device which operates under a condition that high voltage may be generated in a blocking state of the device. In other words, the thickness of a silicon carbide device needed to maintain a certain level of voltage may be significantly thinner than that of a device whose base material is silicon, and therefore it is expected that the silicon carbide device can resolve an antinomic relation between a switching loss and a steady-state loss.

Since silicon carbide has breakdown voltage about ten times as large as silicon, in a silicon carbide device, the width of a depletion layer needed for a certain level of voltage blocking capability is very small. Therefore, the distance between an anode electrode and a cathode electrode is short and accordingly the voltage drop in a current-carrying state which is almost proportional to the electrode distance becomes small. In other words, use of silicon carbide as a base material makes it possible to reduce the steady-state loss caused in the current-carrying state. With this effect, a switching device or a diode using silicon carbide has an advantage of significantly resolving the antinomic relation between the switching loss and the steady-state loss as compared with a switching device or a diode using silicon.

Further, the silicon carbide device, which can operate at a high temperature, has an advantage of simplifying a device cooling system such as a heat sink.

Forming a pn junction in silicon carbide, however, needs heat treatment of much higher temperature than forming a pn junction in silicon and can not disadvantageously use an existing manufacturing facility for silicon.

Furthermore, when a wire is ultrasonically bonded onto an electrode formed on a surface of silicon carbide, a stress generated depending on the conditions such as a load in bonding is applied to the electrode and this changes a condition of junction between the silicon carbide and the electrode, thereby disadvantageously not producing an expected performance.

Moreover, in a silicon carbide device having a conducting board which is in electrical contact with silicon carbide, when there is difference in thermal expansion coefficient between the silicon carbide and the conducting board, a stress caused by heat cycle changes the performance of the device.

SUMMARY OF THE INVENTION

The present invention is directed to a semiconductor device. According to a first aspect of the present invention, the semiconductor device comprises: a silicon carbide layer of predetermined conductivity type comprising a surface having a first region, a second region and a third region sandwiched between the first region and the second region; an anode electrode having a Schottky contact with the first region; a cathode electrode having an ohmic contact with the second region; and a control electrode having a Schottky contact with the third region.

According to a second aspect of the present invention, in the semiconductor device of the first aspect, at least one Schottky barrier electrode out of the anode electrode and the control electrode has a thickness of not less than 5 µm.

According to a third aspect of the present invention, in the semiconductor device of the first aspect, the silicon carbide layer further comprises a back surface opposite to the surface, and the semiconductor device of the third aspect further comprises: a semi-insulation substrate formed on the back surface of the silicon carbide layer; and a metal layer formed on a surface of the semi-insulation substrate.

The present invention is also directed to a module device. According to a fourth aspect of the present invention, the module device comprises: a conducting board; the semiconductor device as defined in the third aspect having the metal layer formed on a surface of the conducting board with a solder layer interposed therebetween; and an encapsulating container for encapsulating the conducting board and the semiconductor device, and in the module device of the fourth aspect, only the semiconductor device is formed on the surface of the conducting board.

The present invention is still directed to a semiconductor device. According to a fifth aspect of the present invention, the semiconductor device comprises: a silicon carbide layer of predetermined conductivity type; and a Schottky barrier electrode having a Schottky contact with a predetermined region on a surface of the silicon carbide layer, and in the semiconductor device of the fifth aspect, the Schottky barrier electrode has a thickness of not less than 5 μm.

According to a sixth aspect of the present invention, the semiconductor device comprises: a silicon carbide layer of predetermined conductivity type; a plurality of electrodes formed on a surface of the silicon carbide layer; and a substrate being brought into electrical contact with at least one electrode out of the plurality of electrodes by an external pressure, and in the semiconductor device of the sixth aspect, the substrate is basically made of any one of carbon, silicon carbide, aluminum, gold, silver and copper.

According to a seventh aspect of the present invention, in the semiconductor device of the sixth aspect, the at least one electrode is a Schottky barrier electrode, and the Schottky barrier electrode has a thickness of not less than 5 μm.

According to an eighth aspect of the present invention, in the semiconductor device of the seventh aspect, the plurality of electrodes include the Schottky barrier electrode formed on a first surface of the silicon carbide layer and an ohmic electrode formed on a second surface of the silicon carbide layer opposite to the first surface, and the semiconductor device of the eighth aspect further comprises: a first substrate being brought into electrical contact with the Schottky barrier electrode by an external pressure; and a second substrate being brought into electrical contact with the ohmic electrode by an external pressure, and in the semiconductor device of the eighth aspect, the first substrate is basically made of any one of carbon, silicon carbide, aluminum, gold, silver and copper, and the second substrate is basically made of any one of carbon, silicon carbide, aluminum, gold, silver and copper.

By the first aspect of the present invention, it is possible to provide a semiconductor device with high breakdown voltage and low loss, which has both a switching function and a diode function (voltage blocking capability of reverse direction) with no pn junction formed therein and eliminate the necessity of serially connected diodes which are needed in the background art.

In the second aspect of the present invention, since a stress applied to at least one Schottky barrier electrode when wire is bonded onto the Schottky barrier electrode can be effectively dispersed and relieved, it is possible to achieve a highly reliable semiconductor device which causes little change in performance at the interface of Schottky contact.

In the semiconductor device of the third aspect of the present invention, it is possible to achieve a switching element of high breakdown voltage with low switching loss and low steady-state loss, which has voltage blocking capability of reverse direction, on the semi-insulation substrate.

In the fourth aspect of the present invention, since there is no necessity of providing any diode in the encapsulating container, it is possible to ensure reduction in size and weight of a module device.

In the fifth aspect of the present invention, a stress applied to the Schottky barrier electrode when wire is bonded onto the Schottky barrier electrode can be effectively dispersed and relieved to prevent a change in level of Schottky barrier and performance and it thereby becomes possible to provide a highly reliable semiconductor device.

In the sixth aspect of the present invention, since the substrate can relieve a stress due to heat cycle, it is possible to provide a highly reliable semiconductor device which is unlikely to cause a change in performance.

In the seventh aspect of the present invention, since the Schottky barrier electrode itself can effectively disperse and relieve a stress applied thereto when the Schottky barrier electrode is externally pressed, it is possible to provide a semiconductor device of much higher reliability, which is more unlikely to cause a change in performance.

Since the semiconductor device of the eighth aspect of the present invention is unlikely to cause a change in performance by either the stress due to the heat cycle or the stress caused by external pressure, it is possible to achieve a diode using a silicon carbide layer, which has high reliability.

An object of the present invention is to improve performance of a semiconductor device using silicon carbide as a base material.

More specifically, a first object of the present invention is to develop a silicon carbide device with low loss, having both a switching function and a diode function, to ensure reduction in size and weight of a module device.

Further, a second object of the present invention is to develop a silicon carbide device of high reliability which is unlikely to cause a change in performance even when a stress caused by wire bonding or heat cycle is applied thereto.

These and other objects, features, aspects and advantages of the present invention will become more apparent from the following detailed description of the present invention when taken in conjunction with the accompanying drawings.

DESCRIPTION OF THE PREFERRED EMBODIMENTS

The first preferred embodiment relates to a device for achieving the first object and the second and third preferred embodiments relate to devices for achieving the second object. The preferred embodiments of the present invention will be discussed below, referring to figures.

The First Preferred Embodiment

A characteristic feature of a semiconductor device of the first preferred embodiment lies in that an anode electrode of a switching device (MESFET: Metal Semiconductor Field Effect Transistor) formed on a silicon carbide layer is made of a metal having a Schottky contact with a surface of the silicon carbide layer. This characteristic feature will be discussed in detail below, referring to FIG. 1.

Figure 1:
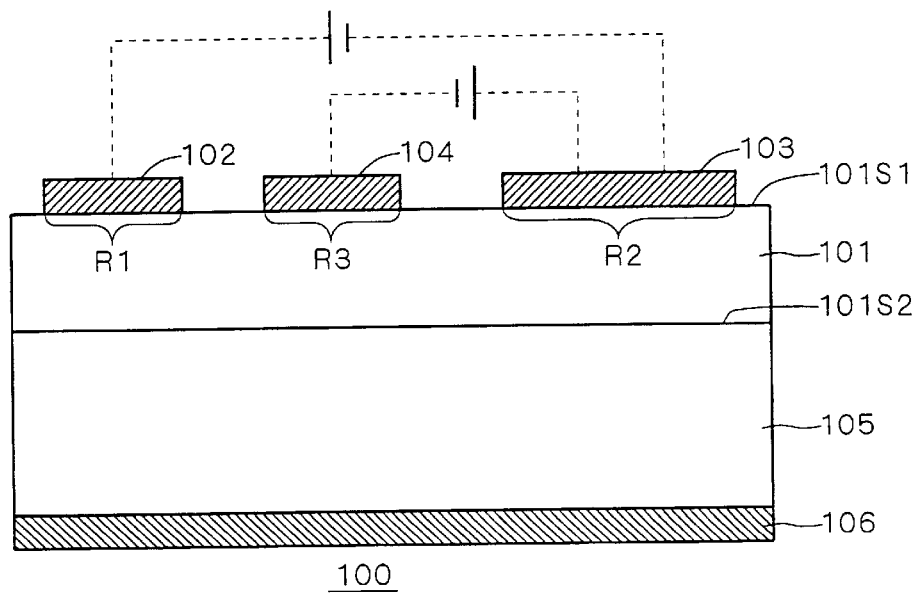
FIG. 1 is a vertical cross section showing a structure of a semiconductor device in accordance with a first preferred embodiment of the present invention.

FIG. 1 is a vertical cross section showing a structure of a semiconductor device 100 in accordance with the first predetermined of the present invention. The semiconductor device 100 has a switching element or MESFET basically made of silicon carbide and moreover the switching element has voltage blocking capability of reverse direction.

The MESFET shown in FIG. 1 has a silicon carbide layer 101 of predetermined conductivity type (herein n type) as a base material or underlying layer. A surface or main surface 101S1 of the n-type silicon carbide layer 101 partially has a first region R1, a second region R2 opposed to the first region R1 and a third region R3 sandwiched between the first region R1 and the second region R2. Further, the MESFET has an anode electrode or Schottky drain electrode 102 having a Schottky contact with the first region R1 of the surface 101S1. In other words, the Schottky drain electrode 102 is a Schottky barrier electrode. Furthermore, the MESFET has a cathode electrode or ohmic source electrode 103 having an ohmic contact with the second region R2 of the surface 101S1. In other words, the ohmic source electrode 103 is an ohmic electrode. The MESFET has a control electrode or Schottky gate electrode 104 having a Schottky contact with the third region R3 of the surface 101S1. In other words, the Schottky gate electrode 104 is a Schottky barrier electrode.

A semi-insulation substrate 105 made of, e.g. semi-insulating GaAs substrate is formed on a back surface 101S2 opposite to the surface 101S1 of the n-type silicon carbide layer 101. Further, a metal layer 106 is formed on a surface of the semi-insulation substrate 105 by vapor deposition and the like.

The MESFET with such a structure, which has the drain electrode 102 made of a metal forming a Schottky barrier, achieves a state where a Schottky barrier diode is formed between the drain electrode 102 and the source electrode 103. Therefore, the MESFET has both a switching function and a diode function. In other words, the MESFET comprises a structure in which a switching element and a diode are unified. For this reason, the semiconductor device 100 has voltage blocking capability of reverse direction with no pn junction formed in the silicon carbide layer and does not need any serial diode which is needed in the background art. Moreover, the semiconductor device 100, which has the silicon carbide layer 101 as a base material of the switching element, maintains an advantageous function of switching element with high breakdown voltage and low loss.

Figure 2:
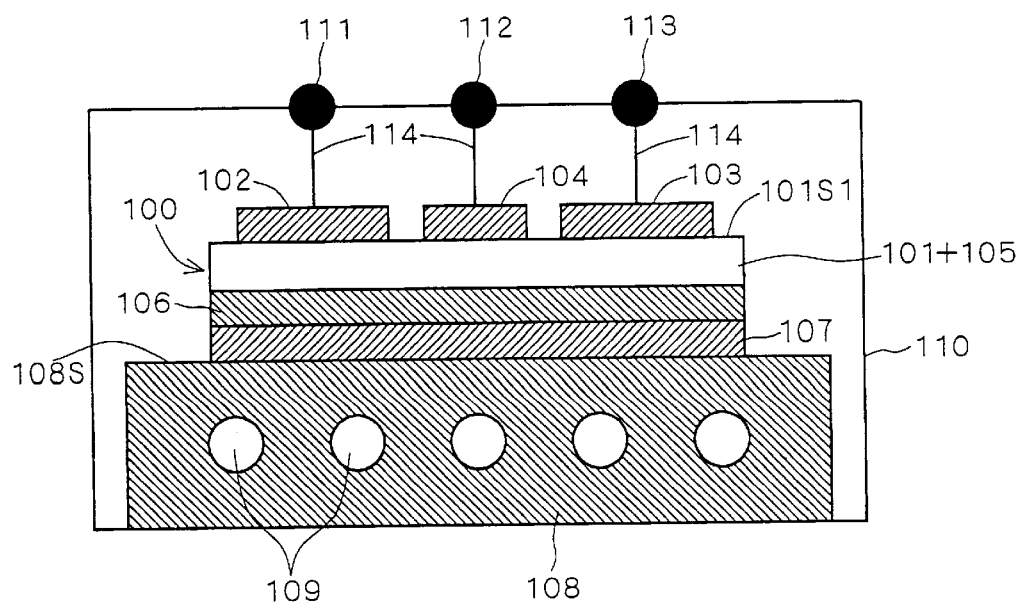
FIG. 2 is a vertical cross section showing a structure of a module device in accordance with the first preferred embodiment of the present invention.

FIG. 2 is a vertical cross section showing a structure of a module element or module device having only the semiconductor device 100 of FIG. 1 therein.

The semiconductor device 100 using silicon carbide is provided in an encapsulating container 110 in the following manner. Specifically, the metal layer 106 of the semiconductor device 100 is soldered onto a surface 108S of a conducting board 108, thereby forming a radiation path from the metal layer 106 through a solder layer 107 to the conducting board 108. Further, the conducting board 108 has a hollow trench 109 which serves as a heat sink and in the trench 109, a cooling medium such as water is circulated. On the other hand, the drain electrode 102, the source electrode 103 and the gate electrode 104 of the MESFET are connected to a drain-electrode conducting bar 111, a source-electrode conducting bar 113 and a gate-electrode conducting bar 112 with bonding wires 114, respectively. The heat generated by loss of the MESFET is radiated through the radiation path and the path of cooling medium.

Thus, in the module device of the first preferred embodiment, the encapsulating container 110 encapsulates the conducting board 108 and the semiconductor device 100. Moreover, only the semiconductor device 100 is provided on the surface 108S of the conducting board 108 and any serial diode which is needed in the background art is not provided. Therefore, the module device of the first preferred embodiment is advantageously smaller and lighter than the module device shown in FIG. 7.

Variation

At least one Schottky barrier electrode out of the drain electrode 102 and the gate electrode 104 shown in FIG. 1 may have a thickness of 5 $\mu$m or more (the upper limit of thickness depends on the manufacturing capability). The point of adapting this size will be discussed in the second preferred embodiment below.

This variation can effectively disperse and relieve a stress applied to at least one Schottky barrier electrode when the wire is bonded to the Schottky barrier electrode and consequently achieves a highly reliable semiconductor device which causes less change in performance at an interface of Schottky contact.

The Second Preferred Embodiment

The stress applied to the Schottky barrier electrode formed on the silicon carbide layer when the wire is bonded to the Schottky barrier electrode causes a subtle change in level of potential barrier (Schottky barrier) depending on the state of contact face. This change causes a change in performance of the switching element (MESFET). Then, the second preferred embodiment makes such an improvement as to prevent the stress applied to the interface of contact between the Schottky barrier electrode and the silicon carbide layer in wire bonding from affecting the performance of the switching element. Specifically, a semiconductor device of the second preferred embodiment comprises a silicon carbide layer of predetermined conductivity type and a Schottky barrier electrode having a Schottky contact with a predetermined region in a surface of the silicon carbide layer and the thickness of the Schottky barrier electrode is set to be 5 $\mu$m or more. The second preferred embodiment will be discussed below, referring to figures.

Figure 3:
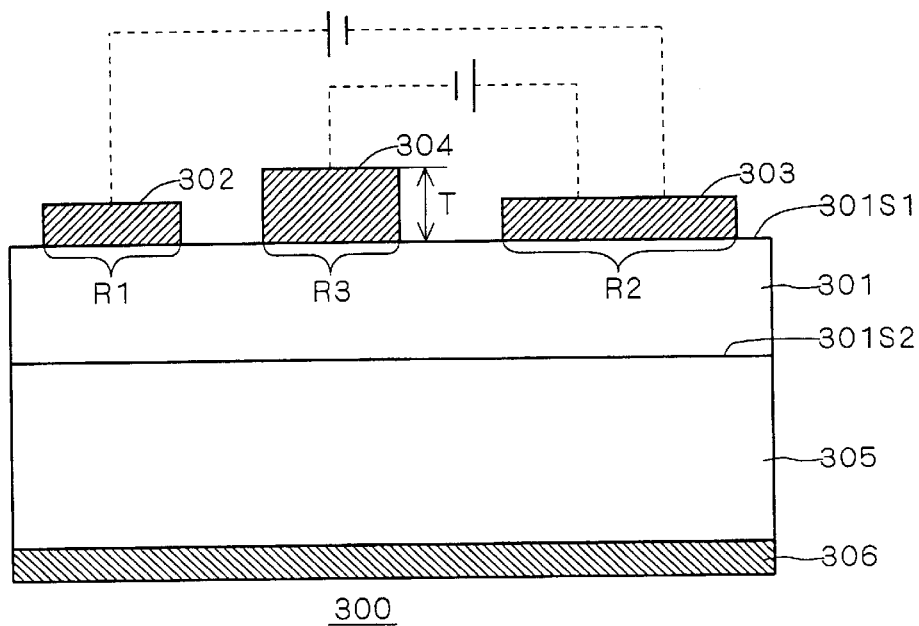
FIG. 3 is a vertical cross section showing a structure of a semiconductor device in accordance with a second preferred embodiment of the present invention.

FIG. 3 is a vertical cross section showing a structure of a semiconductor device 300 in accordance with the second predetermined of the present invention. The semiconductor device 300 has a metal semiconductor field effect transistor formed on a semi-insulation substrate 305. First, on a surface 301S2 of the semi-insulation substrate 305, an n-type silicon carbide layer 301 is formed as an underlying layer. A surface or main surface 301S1 of the n-type silicon carbide layer 301 partially has a first region R1, a second region R2 opposed to the first region R1 and a third region R3 sandwiched between the first region R1 and the second region R2. Further, on the first region R1 of the surface 301S1 formed is an anode electrode or an ohmic drain electrode 302 having an ohmic contact with the first region R1. Further, on the second region R2 of the surface 301S1 formed is a cathode electrode or ohmic source electrode 303 having an ohmic contact with the second region R2. On the third region R3 of the surface 301S1 formed is a Schottky gate electrode 304 having a Schottky contact with the third region R3. In other words, the gate electrode 304 is a Schottky barrier electrode. The thickness T of the gate electrode 304 is about 5 µm or more. On the other hands, on a back surface of the semi-insulation substrate 305, a metal layer 306 is formed by vapor deposition and the like.

Figure 4:
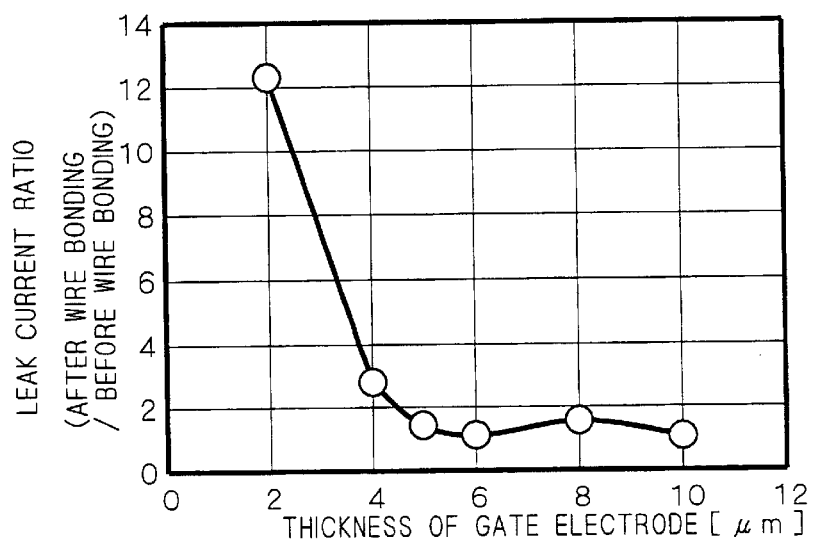
FIG. 4 is a graph showing a measured value indicating a relation between a thickness of a gate electrode and a leak current ratio.

FIG. 4 is a graph showing a measured value indicating a relation between the thickness of a gate electrode (horizontal axis) and the ratio of leak currents which flow when a constant voltage is applied across the ohmic source electrode 303 and the Schottky gate electrode 304 before and after wire is bonded onto the Schottky gate electrode 304 under predetermined conditions (leak current after wire bonding/ leak current before wire bonding) (vertical axis). As shown in FIG. 4, the leak current ratio is affected by the thickness of the gate electrode. When the allowable range of the leak current ratio in measured values of FIG. 4 is set within two, the thickness of the gate electrode which ensures this allowable range should be about 5 µm or more (its upper limit depends on the performance of a manufacturing apparatus). In other words, the experiment indicates that there is little change in leak current before and after wire bonding when the thickness of the gate electrode is set to be about 5 µm or more.

As a result, it is found that by setting the thickness T of the gate electrode 304 to be about 5 µm or more, the stress caused by the wire bonding can be dispersed and relieved and affects the interface of Schottky contact no longer. This can ensure reduction in rate of defectives due to the wire bonding for the gate electrode 304 and achieve a product with high reliability in gate characteristics.

Figure 5:
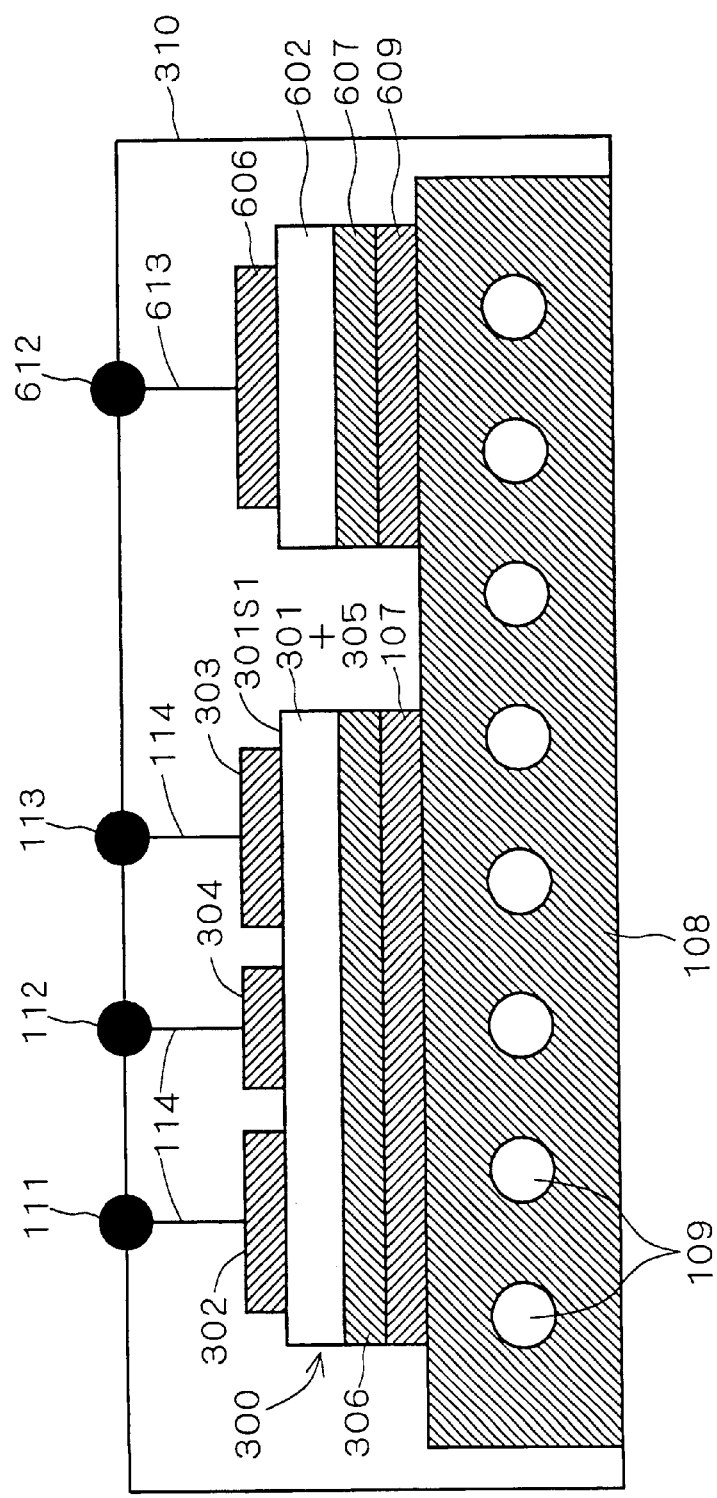
FIG. 5 is a vertical cross section showing a structure of a module device in accordance with the second preferred embodiment of the present invention.
Figure 7:
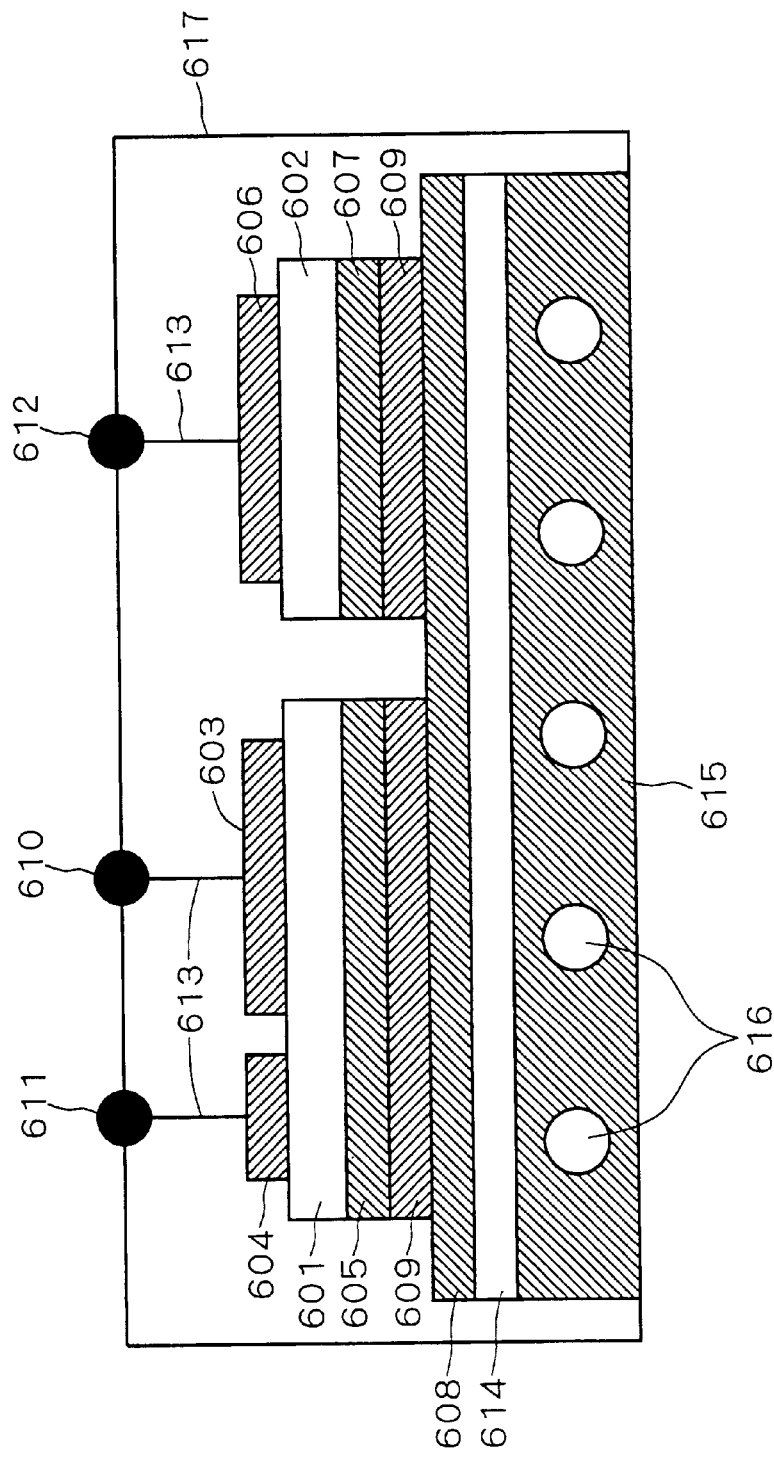
FIG. 7 is a vertical cross section showing a structure of a module device in the background art.

FIG. 5 is a vertical cross section showing an inner structure of a module device in accordance with the second predetermined of the present invention. Reference signs of FIG. 5 identical to those of FIG. 7 represent the same constituent elements. As shown in FIG. 5, the semiconductor device 300 and a diode 602 which should be connected in serial to the semiconductor device 300 are provided on the conducting board 108 and encapsulated in an encapsulating container 310.

The Third Preferred Embodiment

Though a switching element using a silicon carbide layer as a base material has lower loss than that using silicon as a base material, since the switching element of silicon carbide radiates significant heat when it controls large currents, there arises necessity of letting the heat off by a heat sink and the like. Moreover, since the switching element of silicon carbide radiates heat when operates and its temperature becomes ambient temperature when the switching element stops operation, repeating this cycle gives heat cycle to the switching element of silicon carbide. In this case, a medium or substrate being brought into electrical contact with an electrode of the silicon carbide switching element by external pressure serves as a main radiation path and most of the radiation path serves to pass currents, and therefore it is desired that loss of the medium should be small and accordingly the electric conductivity thereof should be high. On the other hand, in order to suppress the stress caused by heat cycle and applied to the silicon carbide switching element, it is necessary that the medium serving as the radiation path should be formed of a material having almost the same thermal expansion coefficient as the material of the silicon carbide switching element.

Then, in the third preferred embodiment, the substrate serving as the radiation path is formed of a material whose base component is either one of carbon graphite and silicon carbide (SiC). These materials have the same thermal expansion coefficient as silicon carbide and high electric conductivity, and moreover ensure low cost.

Alternatively, in the third preferred embodiment, the substrate serving as the radiation path is formed of a material whose base component is any one of aluminum, gold, silver and copper. These materials, which have high electric conductivity and are soft metals, can absorb the difference in thermal expansion coefficient between the silicon carbide layer and the substrate with self-displacement.

Structure and effects of the semiconductor device of the third preferred embodiment will be discussed below, referring to figures, and the reason for selecting the above materials will be also discussed.

Figure 6:
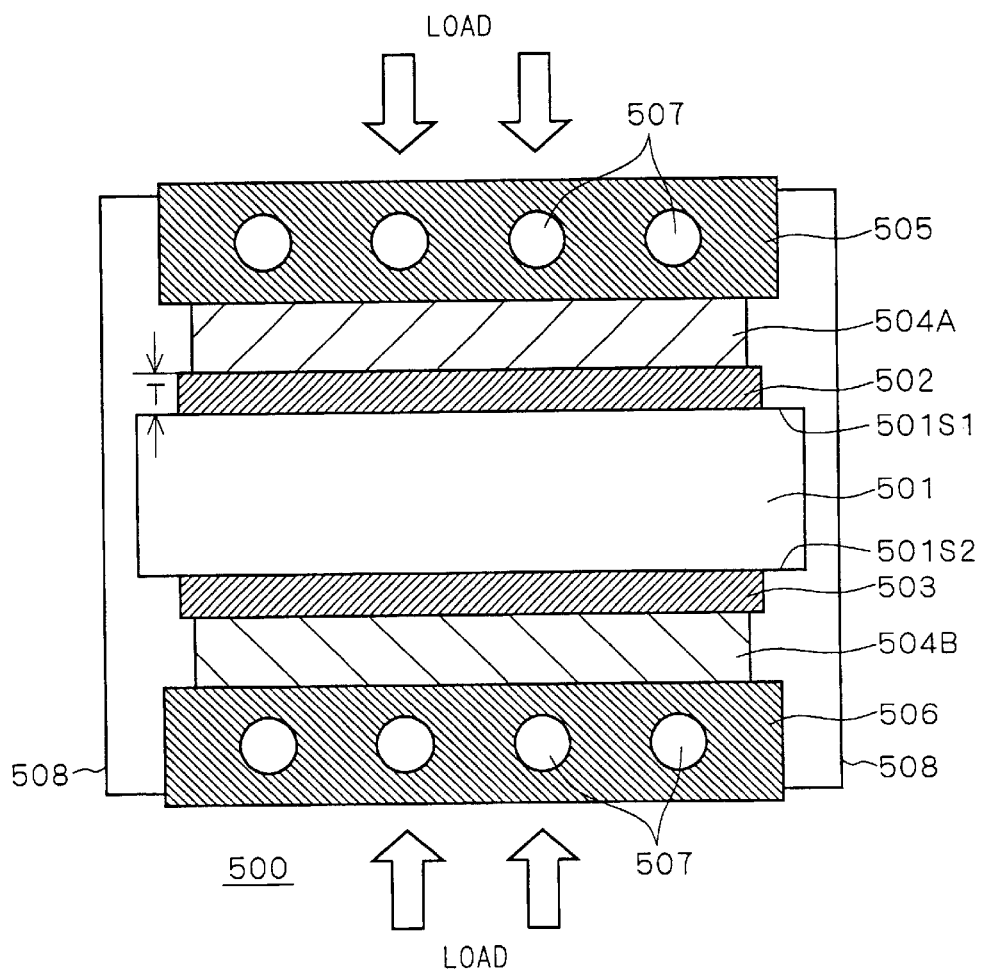
FIG. 6 is a vertical cross section showing a structure of a semiconductor device in accordance with a third preferred embodiment of the present invention.

FIG. 6 is a vertical cross section showing a semiconductor device 500 in accordance with the third preferred embodiment of the present invention. The semiconductor device 500 has a silicon carbide diode. In FIG. 6, on a first surface 501S1 of an n-type silicon carbide substrate forming an n-type silicon carbide layer 501 formed is a Schottky anode electrode 502 made of a metal which forms a Schottky barrier at an interface with the n-type silicon carbide. Further, on a second surface 501S2 (which corresponds to a back surface) opposite to the first surface 501S 1 formed is an ohmic cathode electrode 503 having an ohmic contact with the back surface.

The diode having such a structure is provided in an encapsulating container 508 in the following manner. Specifically, the Schottky anode electrode 502 of the diode is sandwiched between the n-type silicon carbide layer 501 and a first substrate 504A and the ohmic cathode electrode 503 is sandwiched between the n-type silicon carbide layer 501 and a second substrate 504B. The first and second substrates 504A and 504B are made of, e.g., carbon graphite. Further, the Schottky anode electrode 502 and the ohmic cathode electrode 503 are sandwiched between an outer anode electrode 505 and an outer cathode electrode 506 both made of copper. Then, a load is externally applied between the outer anode electrode 505 and the outer cathode electrode 506, and the first and second substrates 504A and 504B are brought into electrical contact with the Schottky anode electrode 502 and the ohmic cathode electrode 503, respectively, by the pressure of the load and the Schottky anode electrode 502 and the ohmic cathode electrode 503 are consequently brought into electrical conduction with the outer anode electrode 505 and the outer cathode electrode 506, respectively.

Furthermore, hollow trenches 507 are formed inside each of the outer anode electrode 505 and the outer cathode electrode 506 and a cooling medium such as water is circulated in each of the trenches 507. With such a structure, the heat generated by the loss caused by carrying currents in the diode is radiated through a first radiation path consisting of the first substrate 504A, the outer anode electrode 505 and the cooling medium and a second radiation path consisting of the second substrate 504B, the outer cathode electrode 506 and the cooling medium.

In this case, the thickness T of the Schottky anode electrode 502 is set to be about 5 µm or more. This setting can relieve the effect of external stress applied to the Schottky anode electrode 502 by the load. This point has been discussed in the second preferred embodiment.

The above-discussed structure in which electrical contact is achieved by the stress has excellent cooling efficiency as it can radiate heat towards the outer electrodes on both sides. Under the repeating heat cycle, however, the stress due to the difference in thermal expansion coefficient of materials is applied to the diode and there may arise a change in performance of the diode.

For the purpose of reducing the change in performance due to such a heat cycle, a selection test of materials to be used for the first and second substrates 504A and 504B is performed. Specifically, using a silicon carbide diode with voltage blocking capability or breakdown voltage of about 700 V and using various materials with relatively high electric conductivity for the first and second substrates 504A and 504B, various diodes to be tested are made. Then, a reverse voltage is applied to the diodes to be tested to thereby check that each diode should have voltage blocking capability of 600 V or more, and thereafter performed is a test in which each diode is pressed by a load of 980 N/cm$^2$ and a cycle from 0° C. (5 minutes) through 150° C. (5 minutes) to 0° C. (5 minutes) is applied 1000 times to the diode in the pressed state. Five samples are used for each material. The result of heat cycle test is shown in Table 1.

TABLE 1

| Material of Board | The Number of Samples for Heat Cycle Test | The Number of Samples with Voltage Blocking Capability Less Than 600 V |
|---|---|---|
| Silicon | 5 | 2 |
| Silicon Carbide | 5 | 0 |
| Carbon (Graphite) | 5 | 0 |
| Aluminum (Purity of 99%) | 5 | 0 |
| Silver (Purity of 98%) | 5 | 0 |
| Gold (Purity of 98%) | 5 | 0 |
| Oxygen-Free Copper | 5 | 0 |
| Tungsten (Purity of 99%) | 5 | 3 |
| Molybdenum (Purity of 99%) | 5 | 2 |
| Nickel (Purity of 99%) | 5 | 4 |
| Iron (Purity of 99%) | 5 | 2 |

Table 1 shows the number of samples for each material whose voltage blocking capability after the test is less than 600 V.

As is clear from Table 1, there is no sample whose voltage blocking capability is less than 600 V after the test when the first and second substrates are made of a material using any one of carbon, silicon carbide, aluminum, gold, silver and copper as a base component, and it is found that substrates made of such a material should have excellent heat cycle resistance.

When a silicon carbide board is adopted for the first and second substrates, as the thermal expansion coefficient of the substrates is equal to that of the base material of silicon carbide diode, it is considered that these first and second substrates give little heat stress to the diode itself. Further, when a board basically made of carbon is adopted for the first and second substrates, it is considered that the polycrystal of carbon in the substrates should change into fine powdery substance to thereby easily absorb the stress due to the difference in thermal expansion coefficient. Further, when a board basically made of any one of aluminum, gold, silver and copper is adopted for the first and second substrates, though each thermal expansion coefficient of these metals is different from that of silicon carbide, it is considered that the metal, which is a soft metal, should easily transform itself to thereby easily absorb the stress due to the difference in thermal expansion coefficient and consequently the stress does not affect the diode so much.

From the above results, it is found good that the first and second substrates 504A and 504B should be formed of a material which is basically made of any of carbon, silicon carbide, aluminum, gold, silver and copper and should be brought into electrical contact with the corresponding electrodes 502 and 503, respectively, by an external pressure. With such a structure, it is possible to remarkably reduce the stress due to the heat cycle, which is applied to the silicon carbide device, and a highly reliably silicon carbide device which is unlikely to cause a change in performance can be provided.

Further, there may be a case where one of the first and second substrates 504A and 504B is formed of a material which is basically made of any one of carbon, silicon carbide, aluminum, gold, silver and copper. In this case, only the one of the substrates has the above effect. In other words, in the third preferred embodiment of the present invention, only a substrate which is brought into electrical contact with at least one of a plurality of electrodes on the surface of the silicon carbide layer by an external pressure has to be basically made of any one of carbon, silicon carbide, aluminum, gold, silver and copper.

While the invention has been shown and described in detail, the foregoing description is in all aspects illustrative and not restrictive. It is therefore understood that numerous modifications and variations can be devised without departing from the scope of the invention.

What is claimed is:

1. A semiconductor device, comprising:
    a silicon carbide layer of a singular conductivity type, comprising a surface having a first region, a second region and a third region sandwiched between said first region and said second region;
    an anode electrode having a Schottky contact with said first region;
    a cathode electrode having an ohmic contact with said second region; and
    a control electrode having a Schottky contact with said third region.

2. The semiconductor device according to claim 1, wherein
    at least one Schottky barrier electrode out of said anode electrode and said control electrode has a thickness of not less than 5 μm.

3. The semiconductor device according to claim 1, wherein
    said silicon carbide layer further comprises a back surface opposite to said surface, and
    said semiconductor device further comprises:
        a semi-insulating substrate formed on said back surface of said silicon carbide layer; and
        a metal layer formed on a surface of said semi-insulating substrate.

4. A module device, comprising:
    a conducting board;
    the semiconductor device as defined in claim 3 having said metal layer formed on a surface of said conducting board with a solder layer interposed therebetween; and
    an encapsulating container configured to encapsulate said conducting board and the semiconductor device,
    wherein only the semiconductor device is formed on said surface of said conducting board.

5. A semiconductor device, comprising:
    a silicon carbide layer of a singular conductivity type;
    a Schottky barrier electrode having a Schottky contact with a predetermined region on a surface of said silicon carbide layer;
    a first ohmic contact electrode formed on a first separate region from said predetermined region; and a second ohmic contact electrode formed on a second separate region from said predetermined region and said first separate region;

wherein said Schottky barrier electrode has a thickness of not less than 5 µm.

6. A semiconductor device, comprising:

a silicon carbide layer of a singular conductivity type;

a plurality of electrodes formed on a surface of said silicon carbide layer; and a substrate being brought into electrical contact with only one electrode out of said plurality of electrodes by an external pressure;

wherein said substrate comprises any one of carbide, silicon carbide, aluminum, gold, silver, and copper.

7. The semiconductor device according to claim 6, wherein said one electrode is a Schottky barrier electrode, and said Schottky barrier electrode has a thickness of not less than 5 µm.

8. The semiconductor device according to claim 7, wherein said plurality of electrodes include said Schottky barrier electrode formed on a first surface of said silicon carbide layer and an ohmic electrode formed on a second surface of said silicon carbide layer opposite to said first surface, said semiconductor device further comprises:

a first substrate being brought into electrical contact with said Schottky barrier electrode by an external pressure; and a second substrate being brought into electrical contact with said ohmic electrode by an external pressure, wherein said first substrate comprises any one of carbon, silicon carbide, aluminum, gold, silver, and copper, and said second substrate comprises one of carbon, silicon carbide, aluminum, gold, silver, and copper.

* * * * *